United States Patent
Waldrop et al.

(10) Patent No.: US 10,783,980 B2
(45) Date of Patent: Sep. 22, 2020

(54) METHODS FOR PARITY ERROR SYNCHRONIZATION AND MEMORY DEVICES AND SYSTEMS EMPLOYING THE SAME

(71) Applicant: Micron Technology, Inc., Boise, ID (US)

(72) Inventors: William C. Waldrop, Allen, TX (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 15/975,697

(22) Filed: May 9, 2018

(65) Prior Publication Data
US 2019/0348139 A1 Nov. 14, 2019

(51) Int. Cl.
| | | |
|---|---|---|
| G11C 29/42 | (2006.01) | |
| G06F 11/10 | (2006.01) | |
| G06F 11/16 | (2006.01) | |
| G11C 7/22 | (2006.01) | |
| G11C 11/4076 | (2006.01) | |
| G11C 11/408 | (2006.01) | |
| G11C 11/16 | (2006.01) | |
| G11C 7/10 | (2006.01) | |
| G11C 29/02 | (2006.01) | |
| G06F 13/16 | (2006.01) | |
| G11C 29/52 | (2006.01) | |

(52) U.S. Cl.
CPC ......... *G11C 29/42* (2013.01); *G06F 11/1032* (2013.01); *G06F 11/1666* (2013.01); *G06F 13/161* (2013.01); *G06F 13/1689* (2013.01); *G11C 7/109* (2013.01); *G11C 7/222* (2013.01); *G11C 11/1693* (2013.01); *G11C 11/408* (2013.01); *G11C 11/4076* (2013.01); *G11C 29/023* (2013.01); *G11C 29/52* (2013.01)

(58) Field of Classification Search
CPC ..... G11C 29/52; G11C 11/4076; G11C 7/109; G11C 11/408; G11C 29/42; G11C 29/023; G11C 7/222; G11C 11/1693; G06F 13/1689; G06F 13/161; G06F 11/1032; G06F 11/1666
See application file for complete search history.

(56) References Cited

U.S. PATENT DOCUMENTS

| | | | | |
|---|---|---|---|---|
| 5,521,878 | A * | 5/1996 | Ohtani | G11C 7/103 365/233.1 |
| 2006/0077751 | A1* | 4/2006 | Oh | G11C 7/1051 365/232 |
| 2013/0346836 | A1* | 12/2013 | Song | G06F 11/10 714/800 |

* cited by examiner

*Primary Examiner* — April Y Blair
*Assistant Examiner* — Sazzad Hossain
(74) *Attorney, Agent, or Firm* — Perkins Coie LLP (57) ABSTRACT

Systems and methods providing for a parity error synchronization based on a programmed parity latency value by delaying an activation of a command disable signal to disable internal commands such that the command disable signal activates just prior to the parity error command.

19 Claims, 8 Drawing Sheets

METHODS FOR PARITY ERROR SYNCHRONIZATION AND MEMORY DEVICES AND SYSTEMS EMPLOYING THE SAME

TECHNICAL FIELD

The present disclosure generally relates to semiconductor memory devices, and more particularly relates to methods for parity error synchronization and memory devices and systems employing the same.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Systems and methods providing for a parity error synchronization based on a programmed parity latency value is disclosed herein. The disclosed systems and methods activates a parity error command path disable signal after the command clock for the command just prior to the parity error command. As a result, the command disable signal arrives too late to disable any external commands that occurred prior to the command with the parity error but just in time to disable the command with the parity error.

As will be discussed further below, elements of the presently disclosed technology described in the context of particular paragraphs and/or Figures may be combined with elements described in the context of other paragraphs and/or Figures. Furthermore, not all elements of the technology disclosed herein are required to practice the technology. Additionally, several details describing structures and/or processes that are well-known and often associated with integrated antennas for medical implants, but that may unnecessarily obscure some significant aspects of the present technology, are not set forth in the following description for purposes of clarity. Moreover, although the following disclosure sets forth several embodiments of the present technology, several other embodiments of the technology have different configurations or different components than those described in this section. As such, the present technology may have other embodiments, with additional elements and/or without several of the elements described below with reference to the figures.

Figure 1:
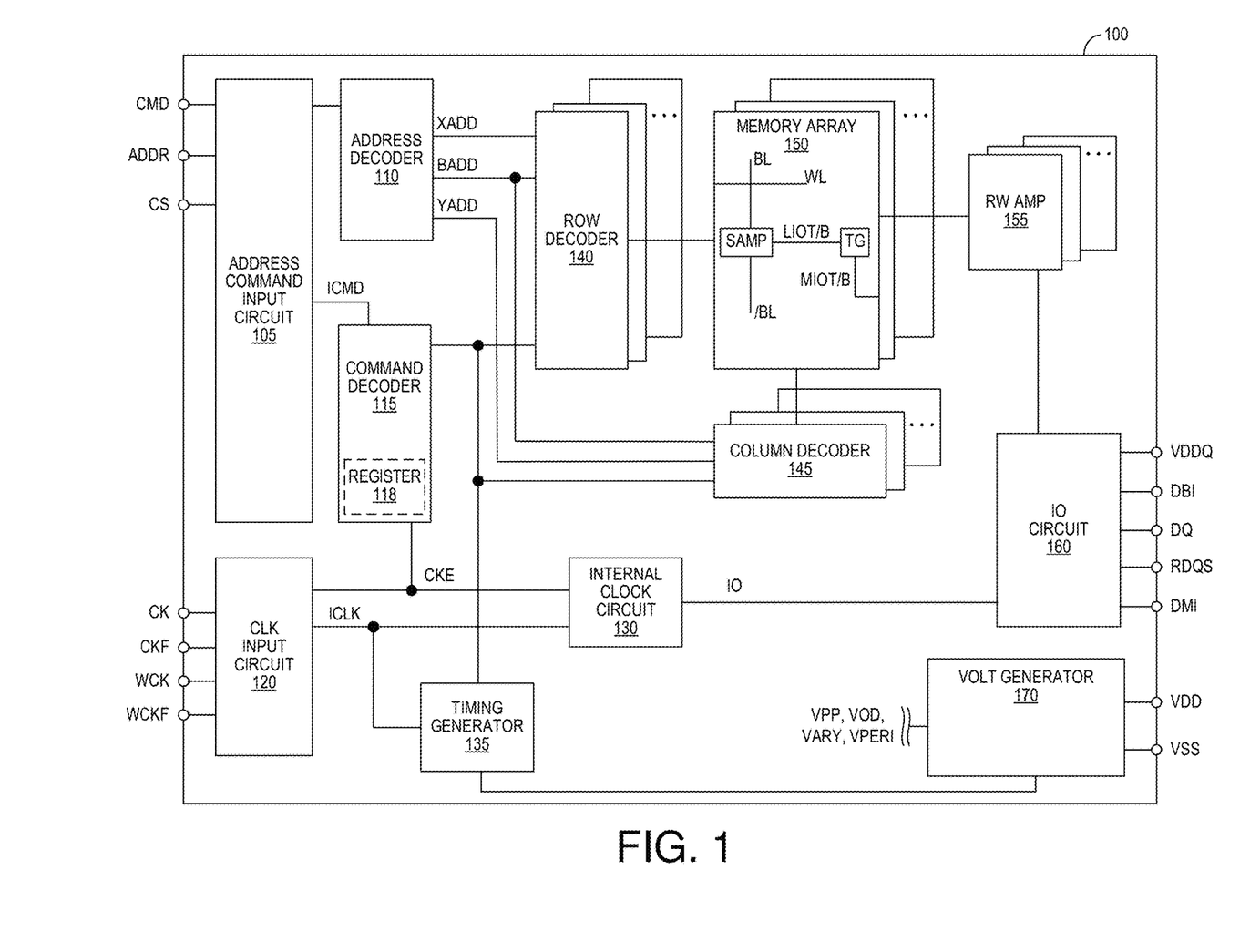
FIG. 1 is a block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 118 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Memory device 100 may also include parity error logic (not shown in FIG. 1) to enable command and address (C/A) parity, detect parity errors in command and address signals, and block command execution and alert the host if a parity error is detected. The additional delay, Parity Latency (PL), for executing commands when C/A parity is enabled versus a parity disabled mode can be programmed in the memory device 100, for example, in a mode register (not shown in FIG. 1). The Parity Latency (PL) can be defined in terms of clock cycles of the CK clock signal. In some embodiments PL is 4, 5, 6, or 8 clock cycles. The Parity Latency is applied to all commands such that a command is held for the time of the Parity Latency before it is executed inside the memory device 100. That is, the issuing timing of internal commands in memory device 100 is determined with PL. Parity Latency may also be applied to write and read latency. When memory device 100 detects a parity error, parity error logic effects a number of actions as discussed below.

Figure 2:
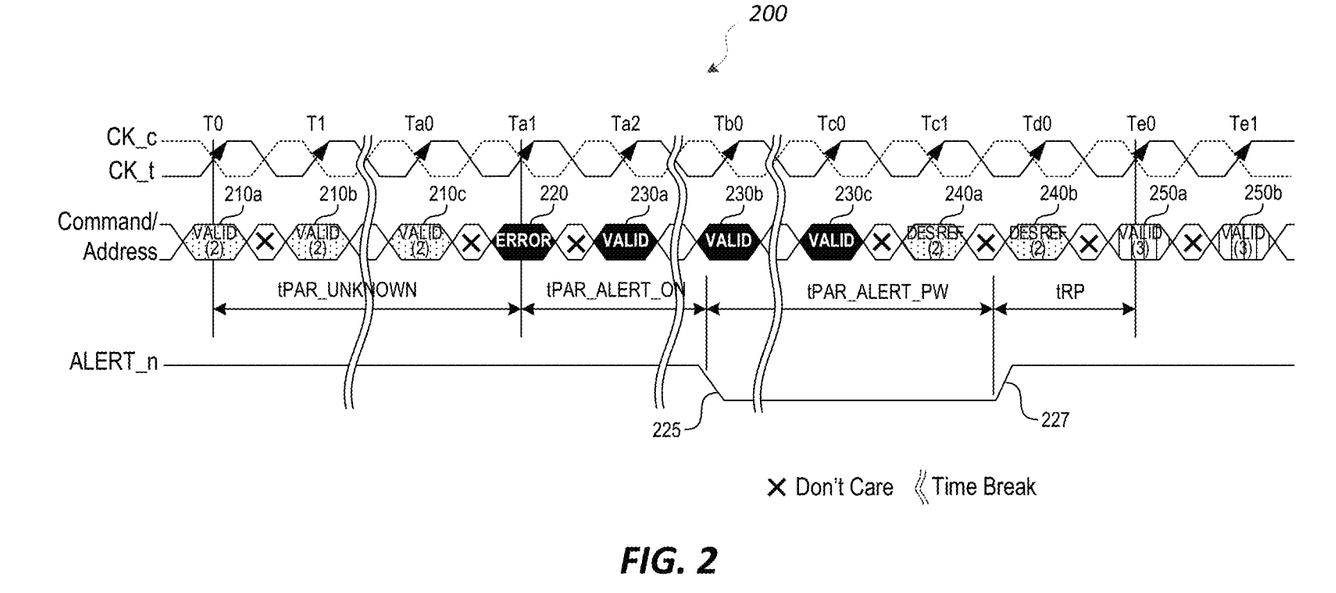
FIG. 2 is a representative plot of parity error alert activation signals in accordance with an embodiment of the present technology.

FIG. 2 illustrates a representative plot of parity error alert activation signals 200 in accordance with an embodiment of the present technology. For purpose of illustration, consider the case shown in plot 200 where the command or address at clock cycle 220 has a parity error. For example, if the convention of parity is even parity such that valid parity is defined as an even number of ones across the command or address inputs combined with the parity signal, the command or address at clock cycle 220 would have a parity error if it had an odd number of ones. Parity error detection logic in memory device 100 detects the parity error that occurred in clock cycle 220 at some time after the error occurred but no later than a maximum specified time, tPAR_ALERT_ON. In some embodiments, tPAR_ALERT_ON is partly based on the programmed Parity Latency value, for example PL+6 ns. After the parity error detection logic detects the parity error, it asserts an alert signal (e.g., sets ALERT_n=1'b0) to the host at time 225. The alert signal (ALERT_n) must be active (e.g., held low) for at least a tPAR_ALERT_PW (min) time but no longer than tPAR_ALERT_PW (max) time. After at least a tPAR_ALERT_PW (min) time, the parity error logic may deactivate the parity alert signal at time 227 (e.g., set ALERT_n=1'b1). In some embodiments, the minimum (tPAR_ALERT_PW (min)) and maximum (tPAR_ALERT_PW (max)) pulse width of the parity alert signal is defined in terms of clock cycles of the CK clock signal, for example tPAR_ALERT_PW (min)=72 CK, and tPAR_ALERT_PW (max)=144 CK.

In some embodiments as shown in plot 200 of FIG. 2, the external commands that occur a certain number of clocks prior to the command with the parity error (command at time 220 in FIG. 2) are not guaranteed to be executed. This "uncertainty" time window in which command execution is unknown is given by a tPAR_UNKNOWN time in FIG. 2. In some embodiments tPAR_UNKNOWN is based on the programmed Parity Latency (PL) value, e.g., if PL=8, tPAR_UKNOWN=8 which means that the external commands that occurred up to 8 clocks prior to clock with the parity error may or may not be executed. When a READ command in tPAR_UKNOWN window is not executed, for example, the memory device 100 does not active DQS outputs.

The parity error logic disables command execution for the command or address with the parity error and all subsequent commands until a precharge recovery period time (tRP) after the parity alert signal is deactivated (ALERT_n=1'b1) (in some embodiments the alert signal is actually deactivated after tRP). That is, memory device 100 is not executing any commands during the window defined by tPAR_ALERT_ON+tPAR_ALERT_PW, where tPAR_ALERT_PW is at least tPAR_ALERT_PW (min), and at most tPAR_ALERT_PW (max). In such embodiments, what external commands will be executed, and which will not, depends on when the parity error logic detects that a parity error occurred in a particular command or address. As a result, command execution is not easily predicted after a parity error as it depends on the tCK (clock period time) and PL (parity latency value) in effect, in addition to process, voltage, and temperature (PVT) variations. That is, depending on how quickly the parity error logic detects that a parity error occurred and disables internal commands, more or less of the external commands that occurred before the parity error would not be executed. It is therefore desirable to have a system where only the external command (or associated address) that had the parity error, and subsequent external commands, is blocked, but external commands that occurred before the parity error are issued, i.e., a system with tPAR_UNKNOWN=0.

Figure 3:
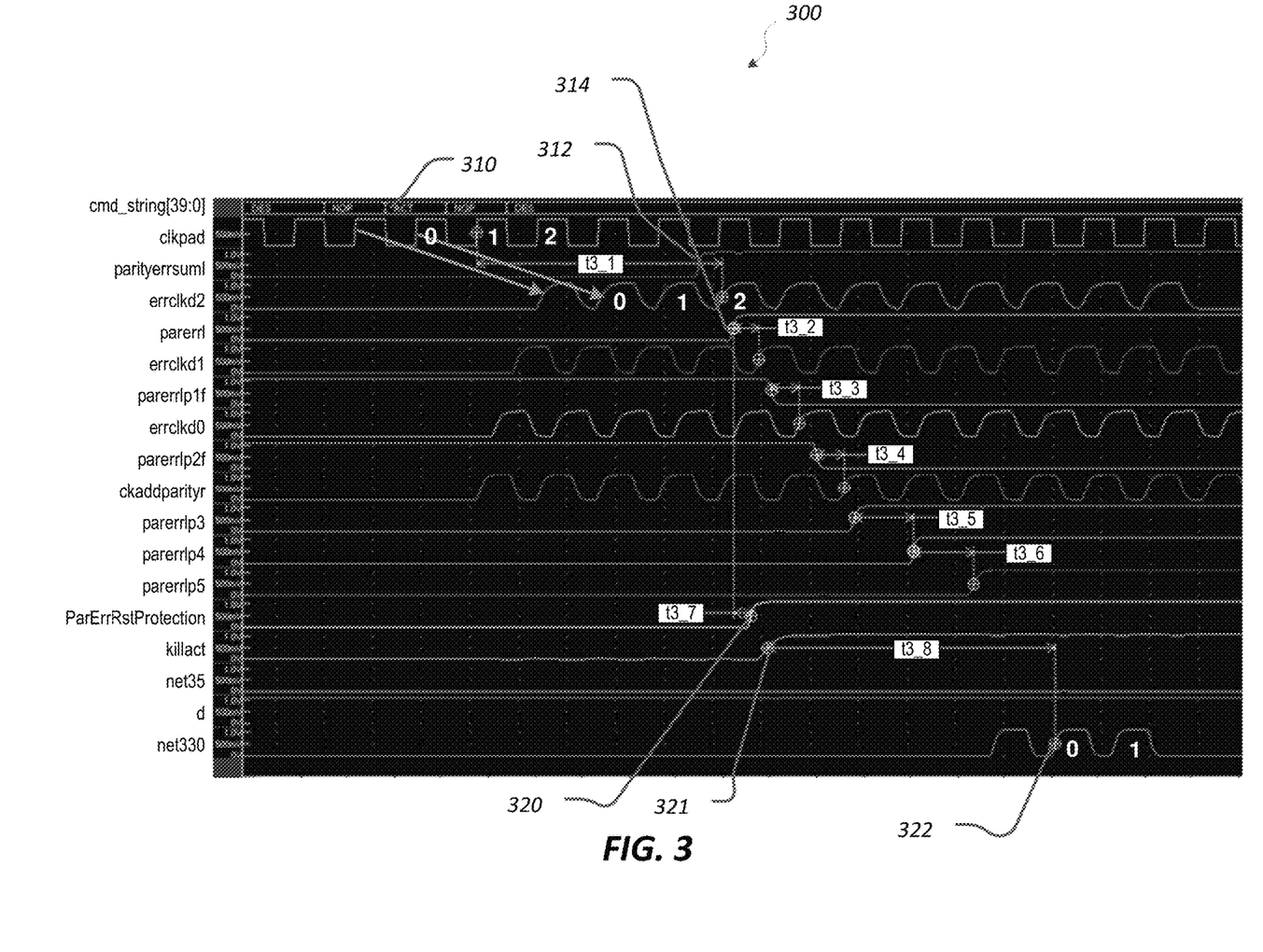
FIG. 3 is a representative plot of parity error command blocking signals in accordance with an embodiment of the present technology.

FIG. 3 is a representative plot 300 of parity error command blocking signals in accordance with an embodiment of the present technology where memory device 100 has C/A parity enabled, where the ACTIVATE command (ACT) at clock cycle 310 has a parity error, and where memory device 100 has a programmed parity latency (PL) value of 8. Parity error logic in memory device 100 computes the parity of command and address signals and at time 312 determines that a command/address parity error occurred at time 310 (for the ACT command) and asserts an asynchronous parity error signal (e.g., ParityErrSumL→1'b1). The asynchronous parity error signal (ParityErrSumL) is latched into a synchronous storage element (e.g., a D flipflop clocked by a clock signal based on CK) to generate a synchronous parity error signal at (e.g., ParErrL) at time 314. In some embodiments, the clock edge used to latch the asynchronous parity error signal is based on the programmed parity error latency (PL) value. For smaller PL values, it is desirable to latch the asynchronous parity error signal sooner because the issuing timing of internal commands in memory device 100 is shorter for smaller PL values. For example, the synchronous parity error can be generated based on the second clock after the offending ACT command at time 310 for PL=5, PL=6, and PL=8, and generated based on the first clock after the offending ACT command for PL=4.

The parity error logic generates at time 320 a parity error command masking signal (e.g., ParErrRstProtection→1'b1). The command masking signal, or a signal derived from, or generated substantially concurrently with, the parity error command masking signal (e.g., killact signal at time 321) masks the execution of any subsequent external commands provided to the memory device 100. By masking the internal commands, the parity error command masking signal disables the execution of the external commands that occurred prior to the offending ACT command at time 310. For example, if the clock edge 322 corresponds to the clock that is PL clocks after the offending command, and time 320 corresponds to a clock S clocks after the offending command, the command masking signal would disable all the internal commands between time 320 and time 322 and hence all the external commands that occurred PL–S clocks prior to the offending command. That is, the tPAR_UNKNOWN=PL–S. This is particularly problematic in the case where the external command requires two commands to execute in the command decoder and only one of the commands is disabled but not the other which may lead to data corruption. It is therefore desirable to have a system where the parity error masking signal is activated/latched only at a clock S=PL such that tPAR_UKNOWN=0 and all the external commands prior to the offending command are not disabled. That means the parity error masking signal must be valid at clock S–1=PL–1 so that it is latched at clock S with sufficient setup time.

Figure 4:
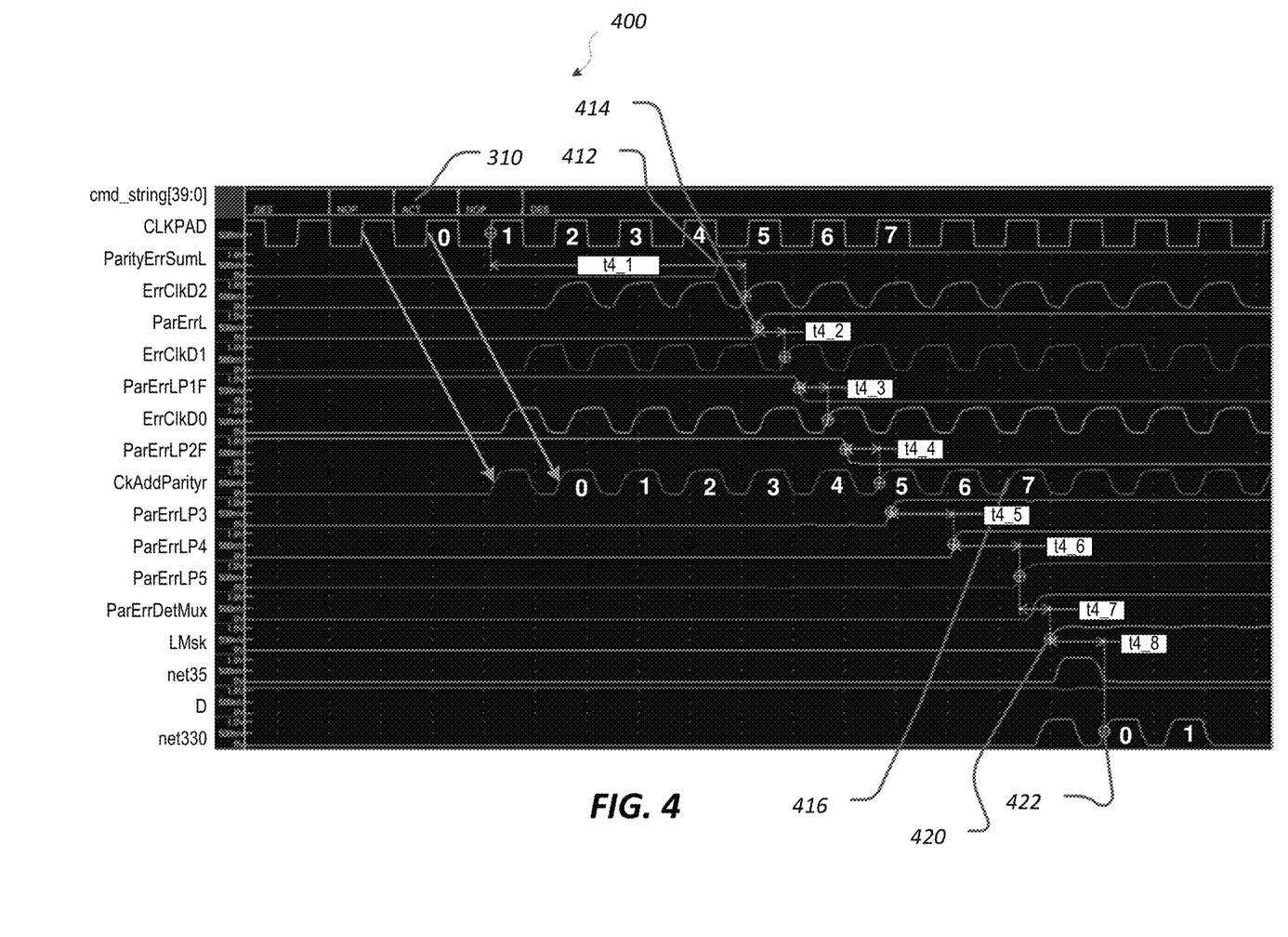
FIG. 4 is a representative plot of synchronized parity error command blocking signals having a first parity latency in accordance with an embodiment of the present technology.

FIG. 4 is a representative plot 400 of synchronized parity error command blocking signals in accordance with an embodiment of the present technology where memory device 100 has C/A parity enabled, where the ACTIVATE command (ACT) at clock cycle 310 has a parity error, and where memory device 100 has a programmed parity latency (PL) value of 8. Parity error logic in memory device 100 computes the parity of command and address signals and at time 412 determines that a command/address parity error occurred at time 310 (for the ACT command) and asserts an asynchronous parity error signal (e.g., ParityErrSumL→1'b1). The asynchronous parity error signal (ParityErrSumL) is latched into a synchronous storage element (e.g., a D flipflop clocked by a clock signal based on CK) to generate a synchronous parity error signal at (e.g., ParErrL) at time 414. The asynchronous detection of the parity error needs to occur as fast as possible to meet the setup and hold timing of the synchronous storage elements used to latch the asynchronous parity error signal (ParityErrSumL) to generate the synchronous parity error signal (ParErrL). This is especially the case for short programmed parity latency values. For example, in some embodiments, the synchronous parity error is generated based on the first clock after the offending ACT command at time 310 for PL<5 and thus the asynchronous detection of the parity error needs to be as fast as possible to provide good downstream timing margin within this time.

The parity error logic generates at time 420 a parity error command masking signal (e.g., LMsk→1'b1). As can be seen in FIG. 4, in this representative embodiment, the parity error masking signal is generated one clock prior to the clock edge 422 corresponding to the clock that is PL clocks after the offending command. For example, for PL=8, the parity error command masking signal is generated at time 416, 7 clocks after the ACT command at time 310 that had a parity error. The parity error command masking signal is latched by clock edge 422 to generate latched command masking signal (not shown in FIG. 4). The latched command masking signal disables the internal commands in progress and masks the execution of any subsequent external commands provided to the memory device 100. Because the latched command masking signal is only active starting PL clocks after the offending external command, only the offending external command and subsequent external commands are disabled but not external commands occurring prior to the offending external command. That is, the command uncertainty window (tPAR_UKNOWN)=0.

In some representative embodiments, the parity error logic generates parity error command blocking signals with timing given by (with respect to FIG. 4): t4_1=2.47 ns, t4_2=269 ps, t4_3=284 ps, t4_4=332 ps, t4_5=616 ps, t4_6=640 ps, t4_7=288 ps, and t4_8=532 ps.

Figure 5:
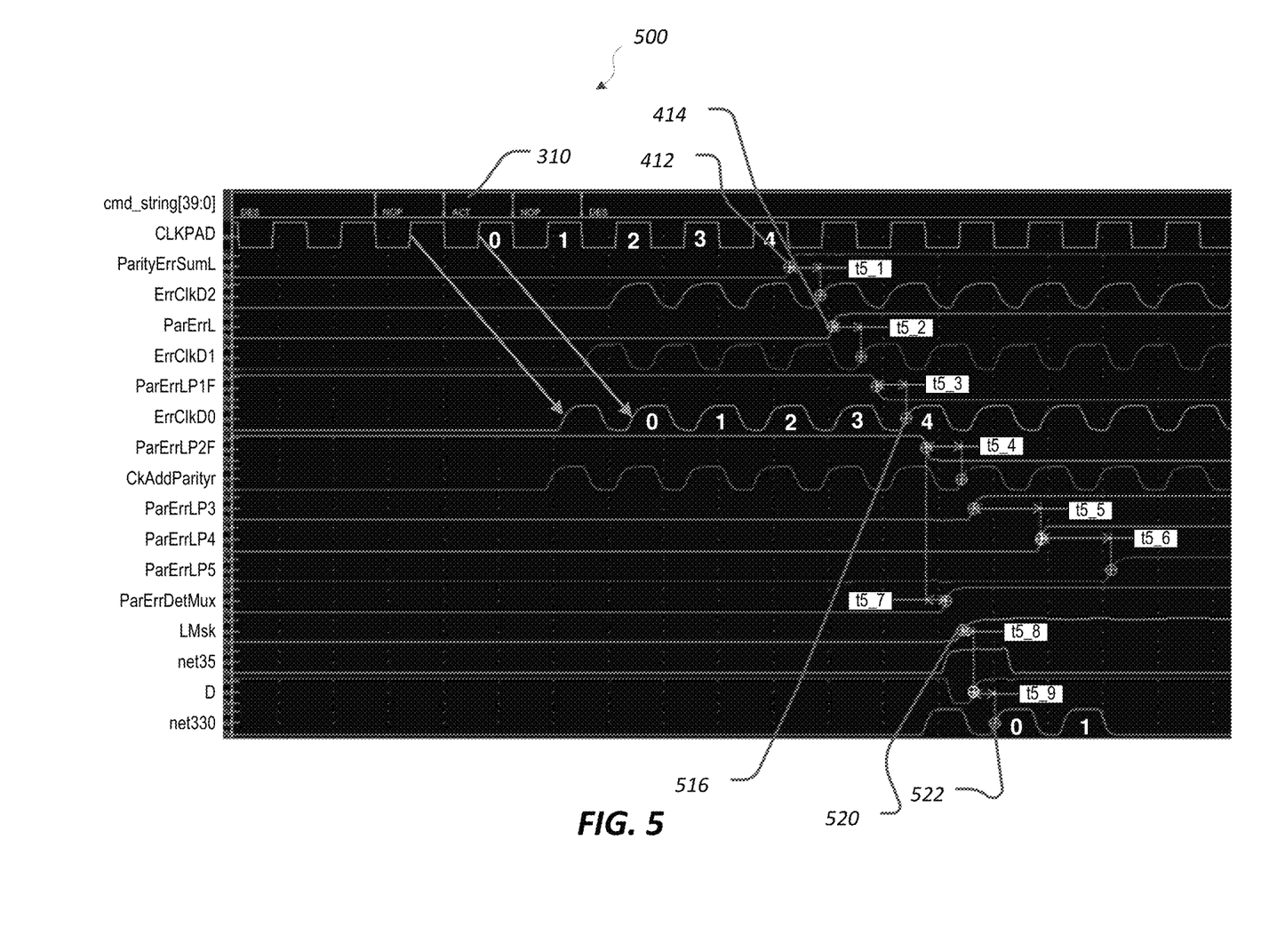
FIG. 5 is a representative plot of synchronized parity error command blocking signals having a second parity latency in accordance with an embodiment of the present technology.

FIG. 5 is a representative plot 500 of synchronized parity error command blocking signals in accordance with an embodiment of the present technology where memory device 100 has C/A parity enabled, where the ACTIVATE command (ACT) at clock cycle 310 has a parity error, and where memory device 100 has a programmed parity latency (PL) value of 5. The parity error logic generates an asynchronous parity error signal (e.g., ParityErrSumL) and synchronous parity error signal (e.g., ParErrL) as described with reference to FIG. 4 above. The parity error logic generates at time 520 a parity error command masking signal (e.g., LMsk→1'b1). The parity error masking signal is generated one clock prior to the clock edge 522 corresponding to the clock that is PL clocks after the offending command. For PL=5, the parity error command masking signal is generated at time 516, 4 clocks after the offending ACT command at time 310. This way, the parity error command masking signal that is latched at clock edge 522 and used to disable commands only disables the offending external command at time 310 and subsequent external commands, but not any external command that occurred prior to the offending command. In this case, similar to the case in FIG. 4, the command uncertainty window is 0 (tPAR_UNKNOWN=0).

In some representative embodiments, the parity error logic generates parity error command blocking signals with timing given by (with respect to FIG. 5): t5_1=282 ps, t5_2=264 ps, t5_3=273 ps, t5_4=328 ps, t5_5=618 ps, t5_6=636 ps, t5_7=184 ps, t5_8=98 ps, and t5_9=198 ps.

Figure 6:
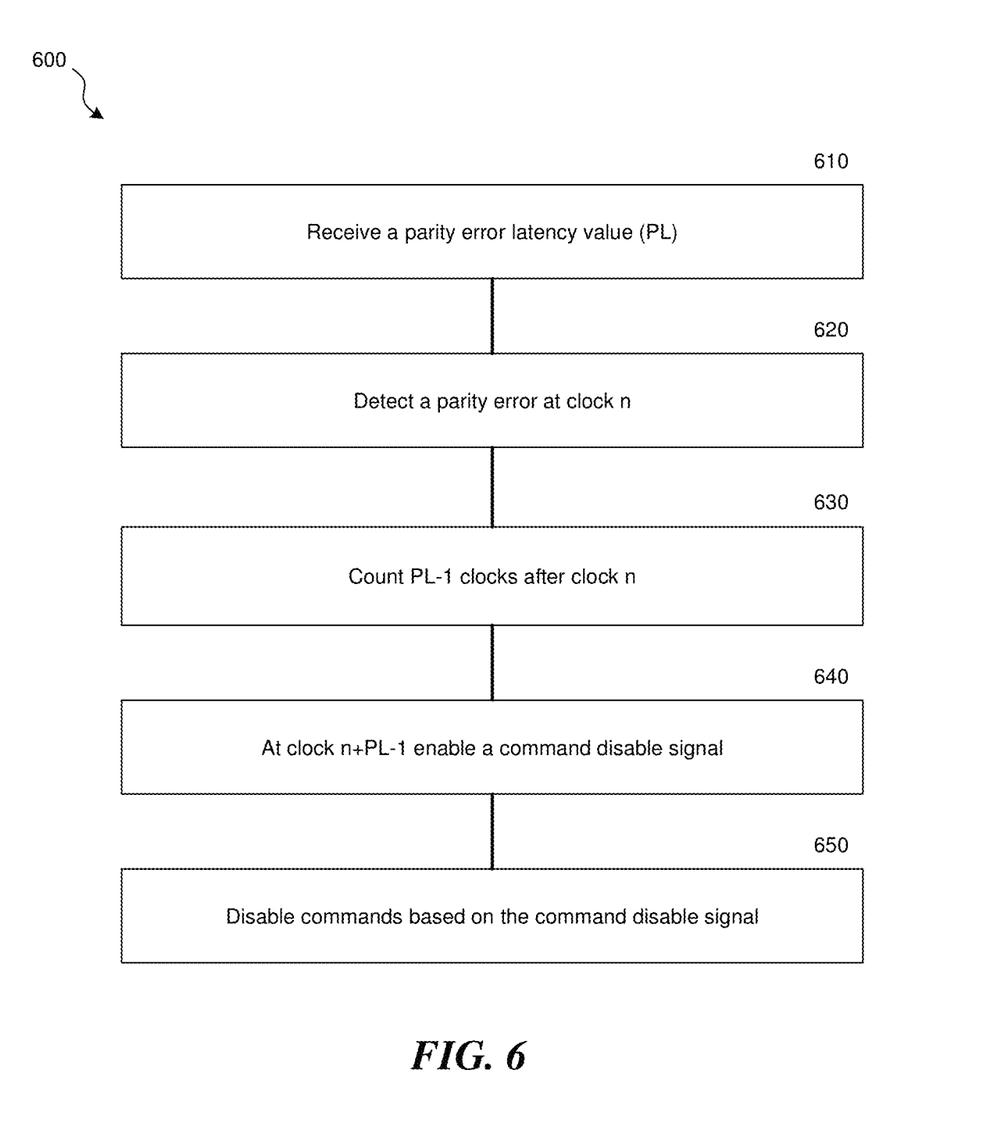
FIG. 6 is a representative flow diagram of a method for implementing synchronized parity error command blocking signals in accordance with an embodiment of the present technology.

FIG. 6 is a representative flow diagram 600 of a method for implementing synchronized parity error command blocking signals in accordance with an embodiment of the present technology. At block 610, the parity error logic receives a parity latency value programmed in memory device 100. At block 620, the parity error logic detects that a parity error occurred at a certain prior clock cycle n. The parity error logic calculates the parity of command and address signals and generates an asynchronous parity error signal if it detects that the command or address signals' parity is different from the parity scheme in use. In some embodiments the asynchronous parity error signal is latched to generate a synchronous parity error a certain number of clocks after it is generated, where the number of clocks depends on the programmed parity latency value (latched sooner for smaller PL values). The timing of the asynchronous generation of the parity error, i.e., how fast the parity error logic calculates parity and determines a violation in required parity, needs to be such that the asynchronous parity error signal is generated with enough setup time relative to the clock signal edge that needs to latch it. For example, if it is latched on the first clock (clock n+1) following the offending command say for PL<5, the asynchronous parity error signal must be generated prior to this clock edge (with sufficient setup and hold time).

At block 630, the parity error logic counts PL−1 clocks after the clock corresponding to the offending command and generates at block 640 a command disable signal (command masking signal) at clock n+PL−1. At block 650 corresponding to clock n+PL, the parity error logic disables commands based on a command disable signal latched by a clock edge in clock cycle n+PL. As a result, only internal commands PL clocks after the offending command detected at block 620 are disabled meaning that commands occurring at clock n−1 or earlier are not disabled.

Figure 7:
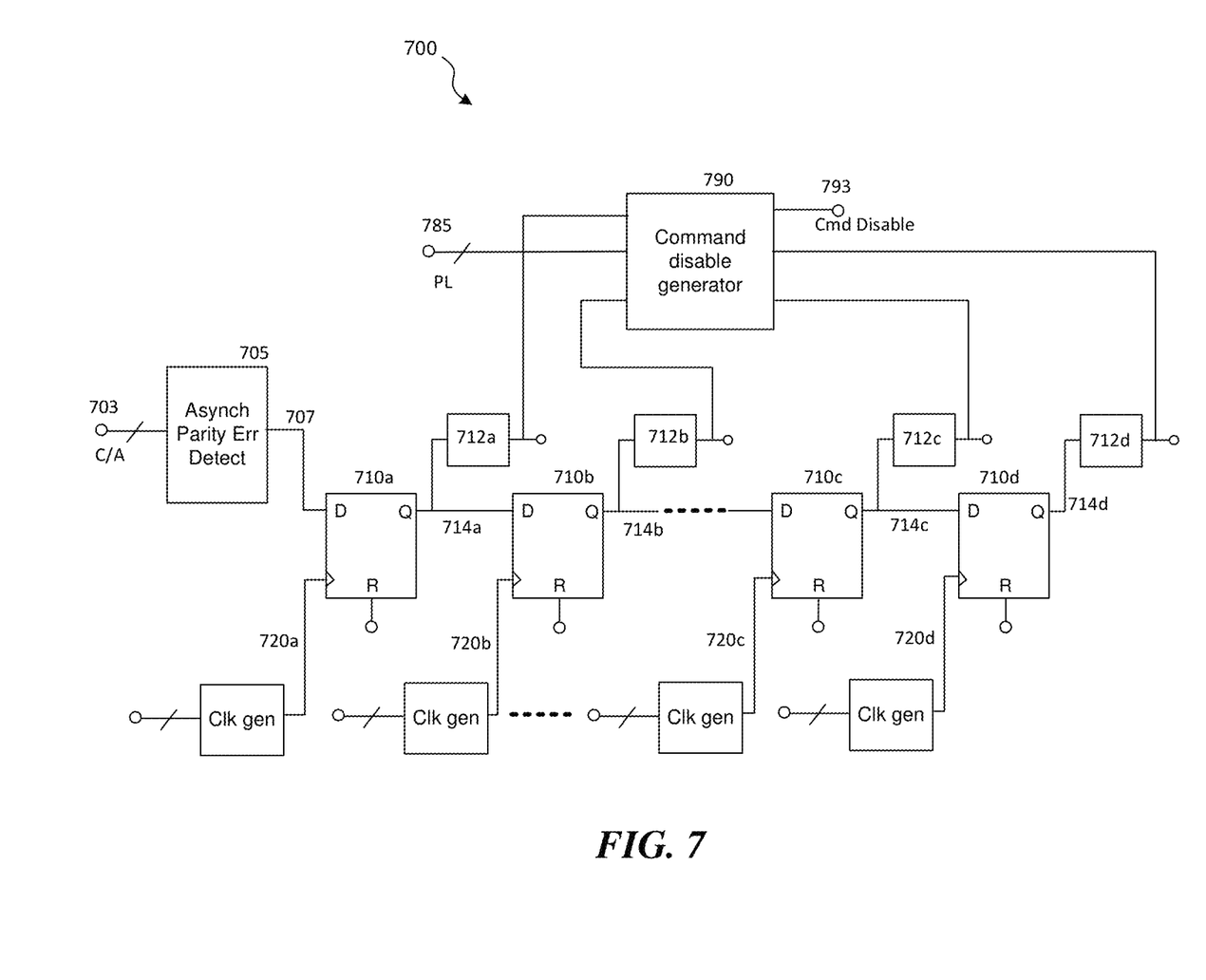
FIG. 7 is a representative system to implement synchronized parity error command blocking in accordance with an embodiment of the present technology.

FIG. 7 is a representative system 700 to implement synchronous parity error command blocking in accordance with an embodiment of the present technology. A block 705 of system 700 determines an asynchronous parity error associated with command or address (C/A) signals 703, and generates an asynchronous parity error signal 707. The asynchronous parity error signal 707 is received in an input port of a synchronous storage element 710a (e.g., at the D-input of a D flip flop). The synchronous storage element 710a is clocked by a clock signal 720a that is based on clock signal CK (in FIG. 1) to generate a synchronous parity error at an output 714a (e.g., at the Q-output of a D flip flop). The output 714a of the first synchronous storage element 710a is received at an input of a second synchronous storage element 710b and clocked by clock signal 720b to generate a delayed synchronized parity error signal 714b. A total of R synchronous storage elements are sequentially arranged (e.g., 710a→710b→ . . . →710c→710d) to form a shift register or FIFO (first-in-first-out) that delays the asynchronous parity error by an amount equal to the position of the synchronous storage element. For example, the output 714b from the second synchronous storage element 710b corresponds to a synchronous parity error that is delayed by two clocks. In some embodiments, the delay of the clock signals 720a, 720b, . . . , 720c, 720d is respectively decreased at each shift stage. For example, the clock signal 720a corresponding to the first stage is delayed more than the clock signal 720b corresponding to the second stage, etc. This is to catch the slower calculated parity error, but speed up the parity command masking signal timing to be as close to the command clock timing as possible to allow for maximum setup time downstream where the parity command masking/disable is latched to disable the commands.

Each of the synchronous outputs (e.g., output 714a, 714b, 714c, 714d) corresponding to each of the synchronous storage elements (e.g., storage element 710a, 710b, 710c, 710d) is processed by corresponding combinational logic (e.g., logic 712a, 712b, 712c, 712d) and received by a command disable generator block 790 which generates a command disable signal 793. The combinational logic elements (e.g., 712a-712d) may be, for example, buffers used to adjust the relative timing of the different synchronous storage element outputs (714a-714d) or may be other combinational logic elements gating the synchronous outputs with other signals so as to obtained signals at the input of the command signal generator 790 that are already pre-processed for some desired functions.

The command disable signal 793 disables the command associated with the parity error and all subsequent commands, but not the command prior to the command that caused the parity error. It does this by appropriately combining signals derived from the several outputs of the synchronous storage elements (714a-714d) based on the programmed parity latency value 785. For example, in some embodiments, if PL=8, it may generate the command disable signal based on the output of the 8'th synchronous storage element such that on the 8'th clock following the offending command, i.e., after the parity latency period, the command disable signal is already active, resulting in the offending command being blocked as well as all subsequent commands. In other embodiments, the output tap point used to generate the command disable signal may be adjusted based on when the asynchronous parity error signal is first latched by the first synchronous storage element. For example, for low PL values, the asynchronous parity error may be sampled sooner and hence the output tap point may be taken at an earlier stage (e.g., if the synchronous parity error is generated based on the second clock after the offending command for PL=8, the command disable signal may be based on the output of the 6'th synchronous storage element). In other embodiments, the command disable signal may be generated based on the 7'th clock following the offending command (for example, for PL=8) and a command masking signal may be generated on the 8'th clock, where the command disable signal disables commands in progress (the command that caused the parity error) and the command masking signal blocks any subsequent external commands received after the command that caused the parity error. It will be appreciated that different well-known logic circuit optimization techniques may be implemented to reduce the number of sequential and combinational logic elements used to generate the command disable signal.

Figure 8A:
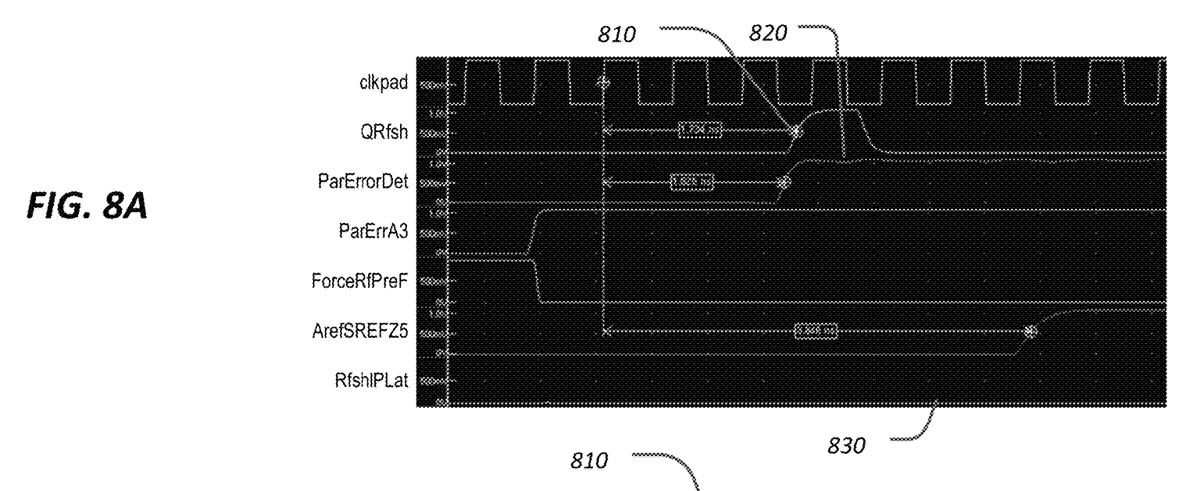
FIG. 8A is a representative plot of a parity error alert activation following a refresh command in accordance with an embodiment of the present technology.
Figure 8B:
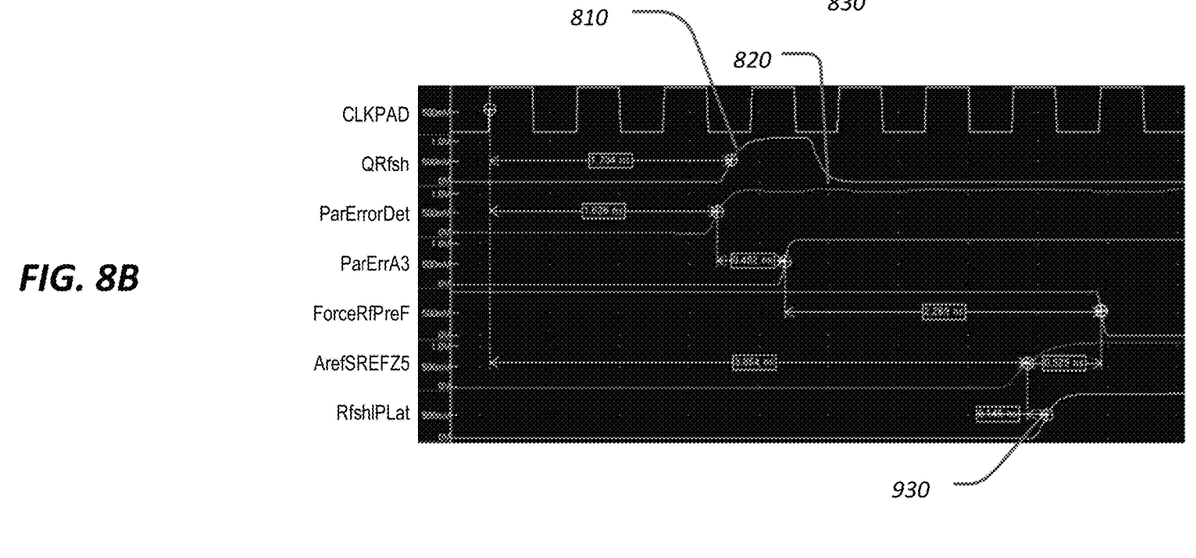
FIG. 8B is a representative plot of a parity error alert activation following a refresh command in accordance with another embodiment of the present technology.

FIGS. 8A and 8B are representative plots of parity error alert activation in accordance with embodiments of the present technology. In FIGS. 8A and 8B, a refresh command corresponding to the command at decode signal 810 is immediately followed by a parity error which generates the parity error signal 820. In FIG. 8A where the parity error disable signal is not synchronized, the refresh command occurring prior to the parity error is not executed as shown by signal 830 being held low. On the other hand, in FIG. 8B where the parity error is synchronized and tPAR_U-KNOWN=0, the refresh command received prior to the parity error is allowed to execute as indicated by signal 930 toggling to a logic one value.

While the present disclosure contains many representative examples, these should not be construed as limitations on the scope of any disclosed methods or of what may be claimed, but rather as descriptions of features that may be specific to particular embodiments of particular disclosed methods. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendices should not be understood as requiring such separation in all embodiments.

From the foregoing, it will be appreciated that specific embodiments of the present technology have been described herein for purposes of illustration, but that various modifications may be made without deviating from the scope of the technology. Further, while advantages associated with certain embodiments of the technology have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

As used herein, the phrase "and/or," as in "A and/or B" refers to A alone, B alone, and A and B. As used herein, the terms "generally," "substantially equal to," and "about" when used to describe numeric values refer to values within 10% of the indicated value.

We claim:

1. A method for operating a memory device, comprising:
   receiving a parity error latency value (PL) corresponding to a quantity of cycles of a clock signal, wherein the PL is a first positive integer;
   detecting a parity error at a clock cycle n of the clock signal, wherein n is a second positive integer and the parity error is at least one of a command parity error or an address parity error;
   generating, in response to detecting the parity error, an asynchronous parity error signal at an output node of an asynchronous parity error generator;
   receiving the generated asynchronous parity error signal at a data input port of a first synchronous storage element, the data input port directly connected to the output node of the asynchronous parity error generator;
   receiving the clock signal at a clock input port of the first synchronous storage element; and
   activating an internal command disable signal at a clock cycle n+PL−1 of the clock signal, wherein the internal command disable signal prevents one or more external commands from executing, the one or more external commands received by the memory device at or after the clock cycle n.

2. The method of claim 1 further comprising:
   latching the asynchronous parity error signal that has been received into the first synchronous storage element at a clock edge of a clock cycle n+m of the clock signal, wherein m is a third positive integer based on the parity error latency value.

3. The method of claim 2, wherein the asynchronous parity error signal is based on a result of a computation of a parity.

4. The method of claim 2, wherein m=2 if the parity error latency value is greater than or equal to 5, and m=1 if the parity error latency value is less than 5.

5. The method of claim 1, wherein activating the internal command disable signal at the clock cycle n+PL−1 further comprises:
   sequentially shifting the asynchronous parity error signal latched in the first synchronous storage element through R−1 subsequent synchronous storage elements, wherein R is a fourth positive integer related to the parity error latency value.

6. The method of claim 5, wherein a data input port of each of the R−1 synchronous storage elements is coupled to a data output port of an immediately preceding synchronous storage element, and a clock signal at a clock input port of each of the R−1 synchronous storage elements is based on the clock signal.

7. The method of claim 5 further comprising:
   generating the internal command disable signal based on a signal of a data output port of the R synchronous storage elements.

8. The method of claim 1 further comprising:
   generating a command masking signal from the internal command disable signal, wherein the command masking signal is delayed from the internal command disable signal by an amount less than a setup time of a synchronous storage register used to latch the internal command disable signal, and wherein the setup time is referenced to a command clock that is used to latch the internal command disable signal into the synchronous storage register.

9. The method of claim 1, wherein the memory device is a DRAM device.

10. A memory device, comprising:
    an asynchronous parity error generator configured to receive a command or address signal and generate an asynchronous parity error signal at an output node of the asynchronous parity error generator; and
    an internal command disable generator coupled to the asynchronous parity error generator and configured to receive the asynchronous parity error signal, a clock signal, and a parity error latency value corresponding to a first quantity of clock cycles of the clock signal, and generate an internal command disable signal based on the asynchronous parity error signal, the clock signal, and the parity error latency value, wherein:
    the internal command disable generator includes a synchronous parity error generator configured to generate at least one synchronous parity error signal based on the asynchronous parity error signal, the clock signal, and the parity error latency value, wherein the synchronous parity error generator has a plurality of synchronous storage elements in a series configuration, a first synchronous storage elements of the plurality with a data input port directly connected to the output node of the asynchronous parity error generator and configured to receive the asynchronous parity error signal, and a clock input port coupled to the clock signal.

11. The memory device of claim 10, wherein the command or address signal that caused the asynchronous parity error generator to generate the asynchronous parity error signal corresponds to a first clock cycle of the clock signal, and wherein the internal command disable generator is configured to generate the internal command disable signal based on a clock edge of a second clock cycle of the clock signal, the first clock cycle preceding the second clock cycle by a second quantity of clock cycles that is one clock cycle less than the first quantity of clock cycles.

12. The memory device of claim 10, wherein the internal command disable signal is configured to prevent an internal command from executing, the internal command associated with the command or address signal that caused the asynchronous parity error generator to generate the asynchronous parity error signal.

13. The memory device of claim 10, wherein the internal command disable generator further comprises:
    a combinational logic block configured to receive the at least one synchronous parity error signal from the synchronous parity error generator and to adjust a timing of the at least one synchronous parity error signal such that the internal command disable generator can generate the internal command disable signal based on the at least one synchronous parity error signal and the parity error latency value.

14. The memory device of claim 12, wherein the internal command disable signal is configured to prevent one or more external commands from executing, the one or more external commands received by the memory device after a command associated with the command or address signal that caused the asynchronous parity error generator to generate the asynchronous parity error signal.

15. The memory device of claim 12, wherein the internal command disable generator is configured to allow execution of one or more external commands received by the memory device before a command associated with the command or address signal that caused the asynchronous parity error generator to generate the asynchronous parity error signal.

16. The memory device of claim 10, wherein the synchronous parity error generator is further configured to generate the at least one synchronous parity error signal by latching the asynchronous parity error signal on a clock edge of a second clock of the clock signal after the command or address signal that caused the asynchronous parity error generator to generate the asynchronous parity error signal for the parity error latency value greater than 4, and to generate the at least one synchronous parity error signal by latching the asynchronous parity error signal on a clock edge of an immediately following clock of the clock signal after the command or address signal that caused the asynchronous parity error generator to generate the asynchronous parity error signal for the parity error latency value equal to 4.

17. The memory device of claim 10, wherein the plurality of synchronous storage elements is configured such that a data output port of the first synchronous storage element is coupled to a data input port of a second synchronous storage element, a clock input port of the second synchronous storage element is coupled to the clock signal, and the at least one synchronous parity error signal is generated based on a signal at the data output port of the first synchronous storage element when the parity error latency value is 4, and generated based on a signal at the data output port of the second synchronous storage element when the parity error latency value is greater than 4.

18. The memory device of claim 10, wherein the internal command disable signal is based on the at least one synchronous parity error signal.

19. A memory device, comprising:
    means for receiving a parity error latency value (PL) corresponding to a quantity of cycles of a clock signal, wherein the PL is a first positive integer;
    means for detecting a parity error at a clock cycle n of the clock signal, wherein n is a second positive integer and the parity error is at least one of a command parity error or an address parity error;
    means for generating, in response to detecting the parity error, an asynchronous parity error signal at an output node of an asynchronous parity error generator;
    means for receiving the generated asynchronous parity error signal at a data input port of a first synchronous storage element, the data input port directly connected to the output node of the asynchronous parity error generator;
    means for receiving the clock signal at a clock input port of the first synchronous storage element; and
    means for activating an internal command disable signal at a clock cycle n+PL−1 of the clock signal, wherein the internal command disable signal prevents one or more external commands from executing, the one or more external commands received by the memory device at or after the clock cycle n.

* * * * *